United States Patent
Wu

(10) Patent No.: US 7,477,063 B1
(45) Date of Patent: Jan. 13, 2009

(54) UNIVERSAL INSERT TOOL FOR FIXING A BGA PACKAGE UNDER TEST

(75) Inventor: Ming-Yen Wu, Hsinchu (TW)

(73) Assignee: Powertech Technologies, Inc., Hsinchuu (TW)

( * ) Notice: Subject to any disclaimer, the term of this patent is extended or adjusted under 35 U.S.C. 154(b) by 0 days.

(21) Appl. No.: 11/889,947

(22) Filed: Aug. 17, 2007

(51) Int. Cl.
*G01R 31/02* (2006.01)

(52) U.S. Cl. ..................................... 324/755
(58) Field of Classification Search ......... 324/751–765, 324/158.1; 439/66, 68, 71
See application file for complete search history.

(56) References Cited

U.S. PATENT DOCUMENTS

| | | | | |
|---|---|---|---|---|
| 5,302,891 A | * | 4/1994 | Wood et al. | 324/765 |
| 5,500,605 A | * | 3/1996 | Chang | 324/758 |
| 6,369,595 B1 | * | 4/2002 | Farnworth et al. | 324/755 |
| 6,636,060 B1 | * | 10/2003 | Saito | 324/755 |

FOREIGN PATENT DOCUMENTS

TW 1253705 B 4/2006

* cited by examiner

*Primary Examiner*—Ha Tran Nguyen
*Assistant Examiner*—Trung Q Nguyen
(74) *Attorney, Agent, or Firm*—Muncy, Geissler, Olds & Lowe, PLLC

(57) ABSTRACT

A universal insert for carrying a BGA package under test primarily comprises a meshed base, at least a latch, and a plurality of lift pins. The meshed base has a component cavity, a mounting surface and a plurality of aligning ball holes in the component cavity where the aligning ball holes are arranged in an array with equal pitch. The latch is disposed inside the meshed base to firmly hold BGA package under test. The lift pins are flexibly extended from the peripheries of the mounting surface of the meshed base. During probe testing, the component cavity accommodates the BGA package inside, at least some of the aligning ball holes are one-on-one aligned to a plurality of solder balls of the BGA package so that the solder balls are exposed from the corresponding aligning ball holes on the mounting surface. Therefore, the universal insert is not limited by the substrate dimension of a BGA package, nor by the number of solder balls, nor by the layout of solder balls and can hold various BGA packages with same ball pitch but with different specifications of BGA package.

9 Claims, 6 Drawing Sheets

UNIVERSAL INSERT TOOL FOR FIXING A BGA PACKAGE UNDER TEST

FIELD OF THE INVENTION

The present invention relates to an IC testing tool, especially, to a universal insert for carrying a BGA package under test regardless of different substrate dimensions and with different numbers of external terminals.

BACKGROUND OF THE INVENTION

More and more IC devices are packaged into Ball Grid Array (BGA) packages where a BGA package has a plurality of solder balls or spherical terminals disposed on the same surface for external electrical connections to achieve higher number of external terminals and smaller dimensions. For example, BGA packages for DRAM or flash have the universal standards of solder balls pitches, however, the substrate dimensions, the number of solder balls, and solder ball locations and distributions are different. When testing different BGA packages with different electronic products, the inserts for carrying the BGA packages and the Hi-fix board of a tester need to be interchanged according to the corresponding BGA packages under test leading to lower utilization rates of a tester and to many insert specifications for different BGA packages.

As shown in FIG. 1, a conventional insert 200 for carrying a BGA package 10 under test is not universal, primarily comprises a window-type base 210 where inside the device cavity of the base 210 has a substrate-alignment opening 211. As shown in FIG. 2, the dimension of the substrate-alignment opening 211 is the same as the substrate dimension of the BGA package 10. The sidewalls of the substrate-alignment opening 211 are aligned to the sidewalls of the BGA package 10 so that the edges of the substrate-alignment opening 211 are formed as an alignment frame 212 to hold and constrain the sidewalls 13 of a BGA package 10. A plurality of solder balls 14 disposed on the ball placement surface 11 of the BGA package 10 are all exposed from the substrate-alignment opening 211. A guiding surface 213 is formed around the alignment frame 212 to easily place and align the BGA package 10. A plurality of holding fingers 214 are formed and protrude in the substrate-alignment opening 211 to hold the BGA package 10 from dropping out of the insert 200. Furthermore, two joint parts 215 are formed on two opposing sides of the window-type base 210 and is connected to a carrier, not shown in the figure. Therefore, even with the same type of BGA packages 10 for different electronic products, the substrate dimensions will change so that the corresponding insert 200 cannot be used to test all the BGA packages 10. Furthermore, different electronic products will use different BGA packages 10 not only with different substrate dimensions, but also with different solder ball numbers and with different solder ball distributions. Different inserts 100 have to be designed and purchased.

A known universal insert for carrying a BGA package had been revealed in R.O.C. patent No. 1253705, where a footprint-alignment opening is disposed in the component cavity of a window-type base with its dimension aligned to the most outer edges of the solder ball distribution area of a BGA package under test which is smaller than the dimension of the substrate. Therefore, various BGA packages 10 with different substrate dimensions can be carried by the insert for alignment and testing. Moreover, the holding fingers can be eliminated. However, the universal insert can only carry BGA packages mentioned above with the same footprints and with the same ball counts. Additionally, the outmost solder balls contacted by the insert are easily damaged or/and dropped by extra shearing stresses.

SUMMARY OF THE INVENTION

The main purpose of the present invention is to provide a universal insert for carrying a BGA package under test which is not limited by the substrate dimensions of the BGA packages, nor by the number of solder balls, nor by the layout of solder balls and can hold various BGA packages with the same ball pitch but with different specifications of BGA packages. Therefore, during testing, the frequency of interchanging inserts can be reduced to increase utilization of testers and to reduce the numbers of inserts in stock.

The second purpose of the present invention is to provide a universal insert for carrying a BGA package under test to accept different specifications of encapsulant to firmly push and hold a BGA package in the base of the insert.

According to the present invention, a universal insert for carrying a BGA package under test comprises a meshed base, at least a latch, and a plurality of lift pins. The meshed base has a component cavity and a mounting surface where a plurality of aligning ball holes are disposed inside the component cavity and arranged in an array with equal pitch. Some of or all of the aligning ball holes are one-on-one aligned to a plurality of solder balls of a BGA package under test so that the solder balls are exposed from the correspondingly aligning ball holes on the mounting surface for probe testing. The latch is disposed inside the meshed base to firmly hold the BGA package. The lift pins flexibly extend from the peripheries of the mounting surface of the meshed base.

DETAIL DESCRIPTION OF THE INVENTION

Please refer to the attached drawings, the present invention will be described by means of embodiment(s) below.

Figure 5:
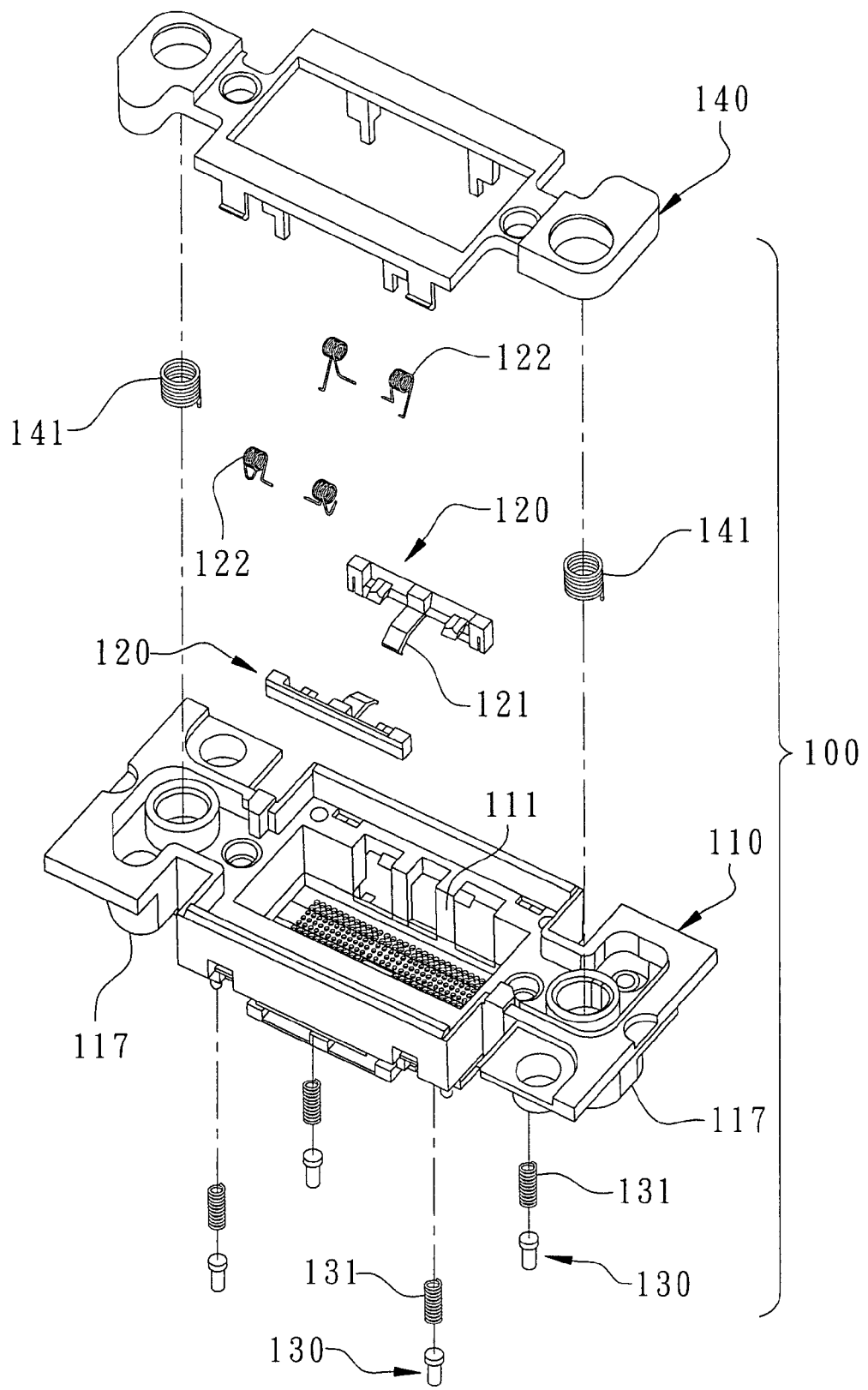
FIG. 5 is an exploded view of the universal insert according to the preferred embodiment of the present invention.
Figure 6:
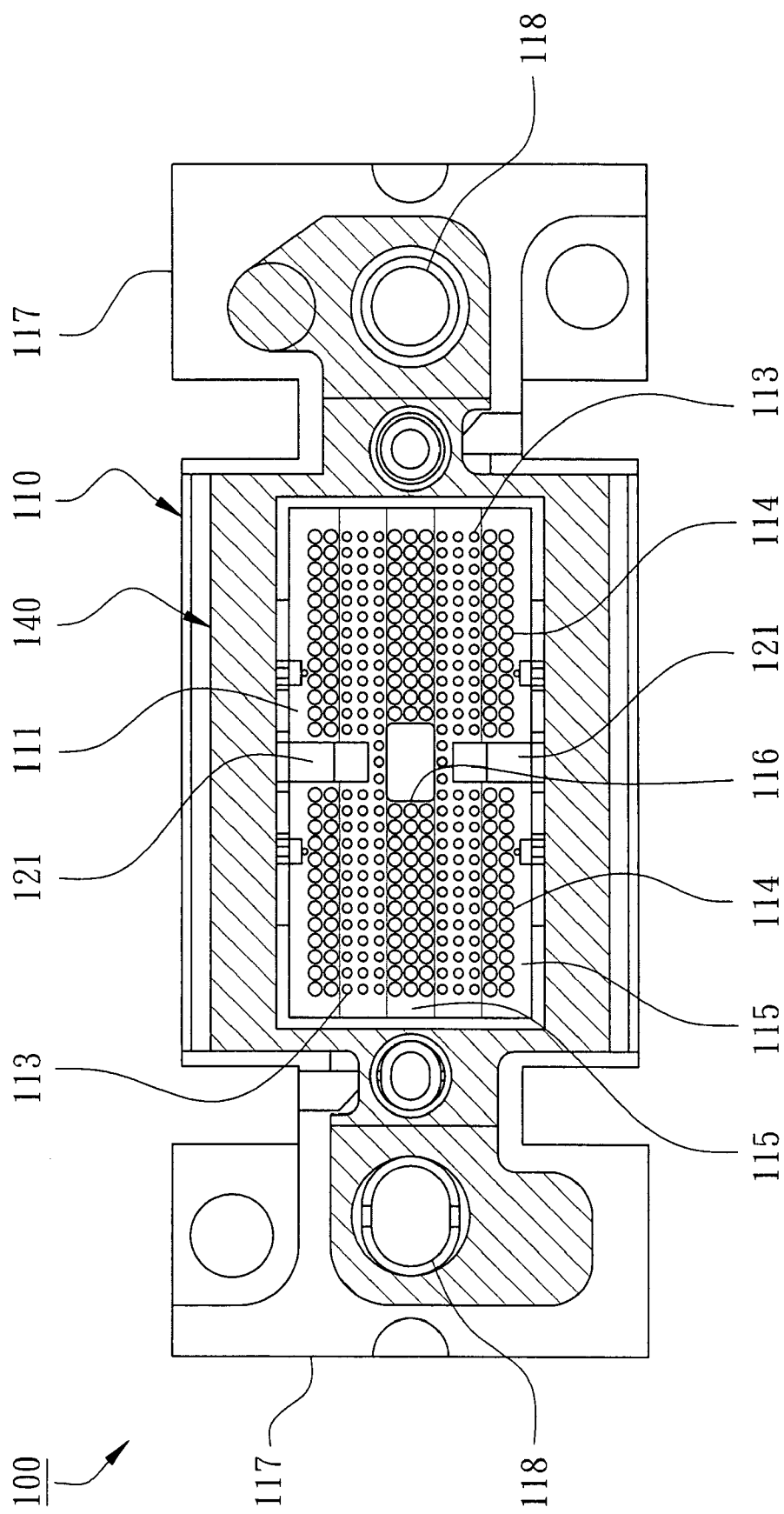
FIG. 6 shows a top view of the universal insert according to the preferred embodiment of the present invention.
Figure 7:
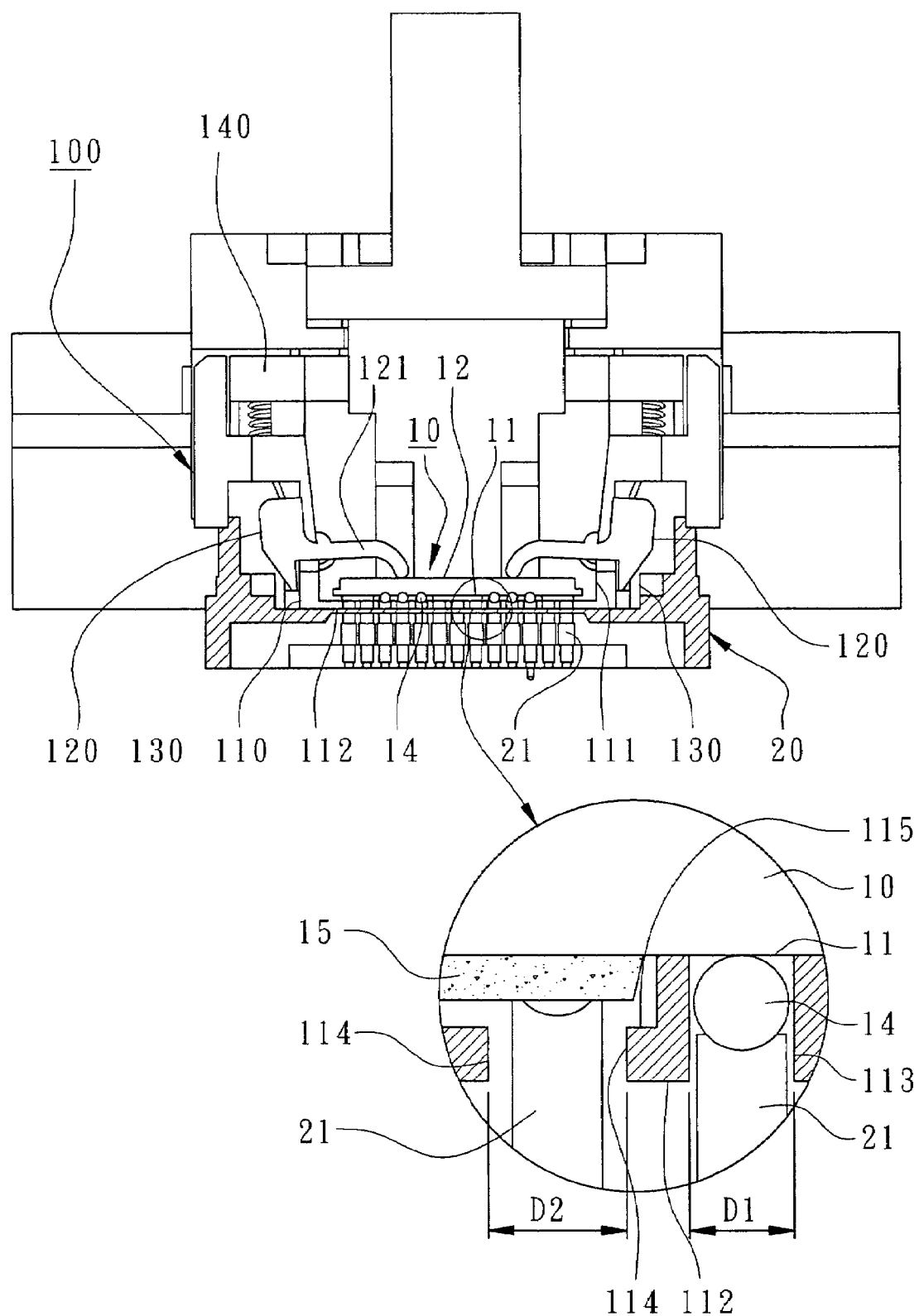
FIG. 7 shows a cross-sectional view of the universal insert during probe testing according to the preferred embodiment of the present invention.
Figure 8:
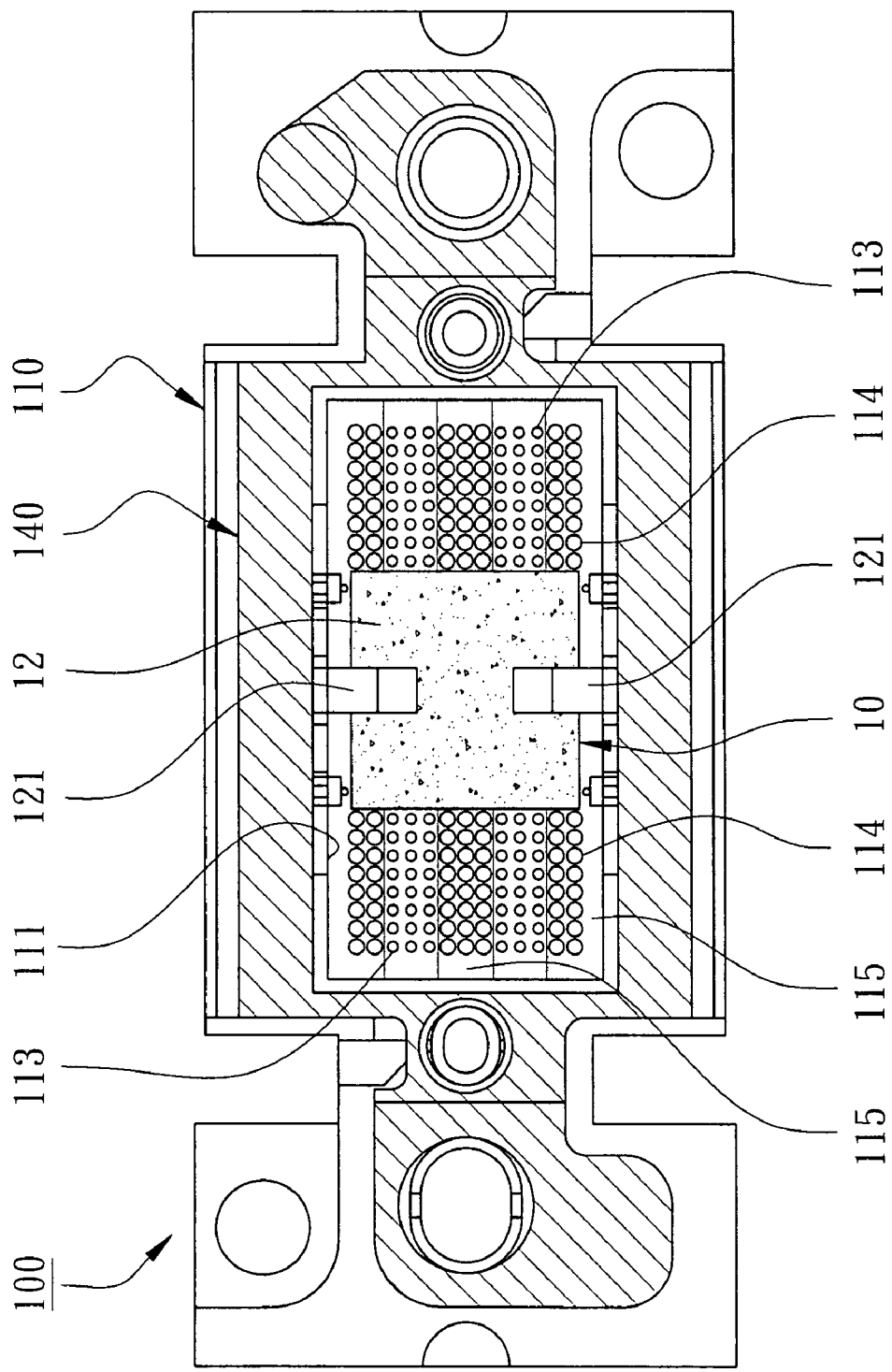
FIG. 8 shows a top view of the universal insert when carrying a BGA package under test according to the preferred embodiment of the present invention.

According to the first embodiment of the present invention, as shown from FIG. 2 to FIG. 8, a universal insert 100 for carrying a BGA package 10 is revealed. As shown in FIG. 7 and FIG. 8, a BGA package 10 has a ball-placing surface 11, a corresponding back surface 112, and sidewalls between the ball-placing surface 11 and the corresponding back surface 112. A plurality of solder balls 14 or spherical terminals are disposed on the ball-placing surface 11 as external terminals for the IC disposed inside the BGA package 10. According to different package designs, at least an encapsulant 15 will extrude from the center or from the edges of the ball-placing surface 11 of the BGA packages 10.

Figure 3:
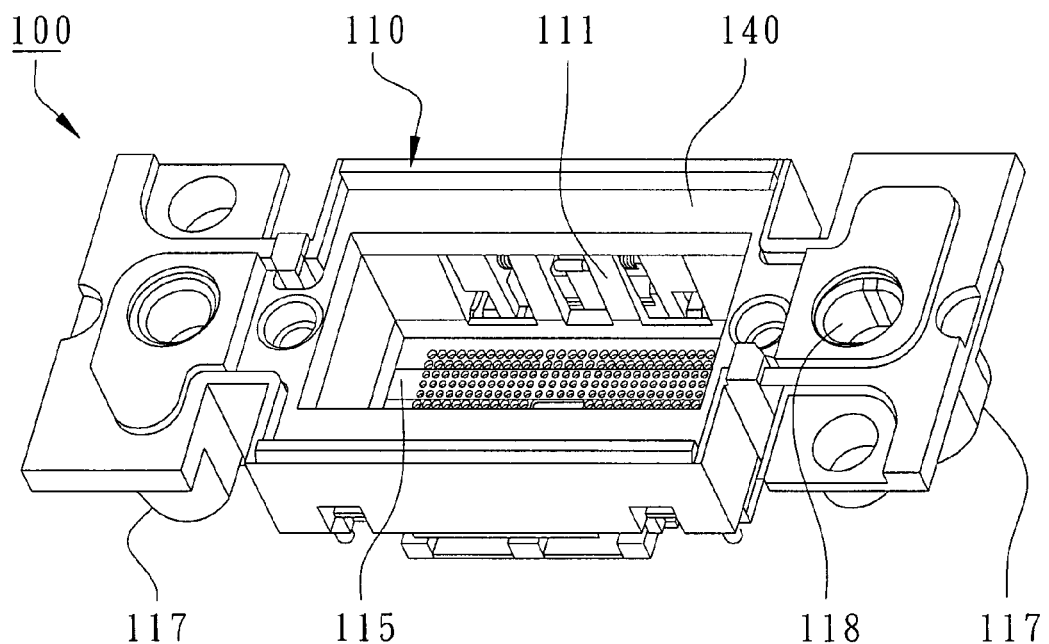
FIG. 3 shows a three-dimensional top view of a universal insert for carrying a BGA package according to the preferred embodiment of the present invention.
Figure 4:
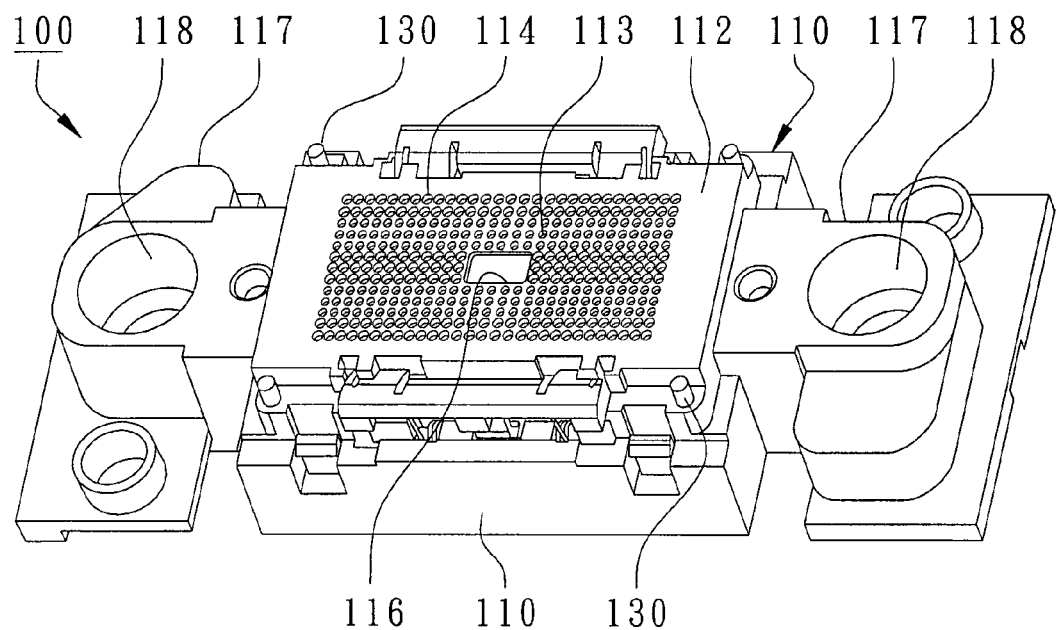
FIG. 4 shows a three-dimensional bottom view of the universal insert according to the preferred embodiment of the present invention.

As shown in FIG. 3, FIG. 4, and FIG. 5, the universal insert for carrying a BGA package 100 primarily comprises a meshed base 110, at least a latch 120, and a plurality of lift pins 130 where the meshed base 110 has a component cavity 111, a mounting surface 112, and a plurality of aligning ball holes 113 and 114 in the component cavity 111. As shown in FIG. 7, the component cavity 111 is used to accommodate a BGA package 10 under test. During testing, the mounting surface 112 will contact with the testing socket 20 with a plurality of probes 21 also known in POGO pins.

As shown in FIG. 6, the plurality of aligning ball holes 113 and 114 are arranged in an array with an equal pitch and are penetrated from the bottom surface of the component cavity 111 to the mounting surface 112. In the present embodiment, the aligning ball holes 113 and 114 are arranged in a 13 by 29 array with an equal pitch of about 0.85 μm from the center of each aligning ball hole 113 or 114 to the center of the adjacent aligning ball hole 113 or 114. As shown in FIG. 7 and FIG. 8, some of or all of the aligning ball holes 113 and 114 are one-on-one aligned to all of a plurality of corresponding solder balls 14 of the BGA packages 10 under test so that the solder balls 14 are exposed from the corresponding aligning ball holes 113 and 114 on the mounting surface 112 for testing by the probes 21. To be more specific, the aligning ball holes can further be divided into two groups, ones are a plurality of first aligning ball holes 113, and the others are a plurality of second aligning ball holes 114 where the hole depths of the second aligning ball holes 114 are smaller than the ones of the first aligning ball holes 113. Preferably, the second ball holes 114 are located within at least a dent 115 which is formed on a bottom surface of the component cavity 111 opposing to the mounting surface 112 for accommodating the encapsulant 15 of the BGA package 10 (as shown in FIG. 7). Accordingly, the ball-placing surface 11 of the BGA package 10 can firmly press against the bottom surface of the component cavity 111. In the present embodiment, the dent 115 is ribbon-like located at two opposing sides of and/or at the center of the bottom surface of the component cavity 111. As shown in FIGS. 6 and 7 again, preferably, the first aligning ball hole 113 has a first diameter D1 and the second aligning ball hole a second diameter D2 where the second diameter D2 is larger than the first diameter D1 so that a larger tolerance is acceptable at a non-central area of the bottom surface of the component cavity 111 to avoid thermal expansion issues between the meshed base 110 and the BGA package 10 under test causing the second aligning ball holes 114 misaligned with the solder balls 14 at the peripheries and leading to electrical open between the second aligning ball holes 114 and the solder balls 14 during testing. Therefore, a BGA package 10 with larger package warpage is acceptable for testing.

Figure 1:
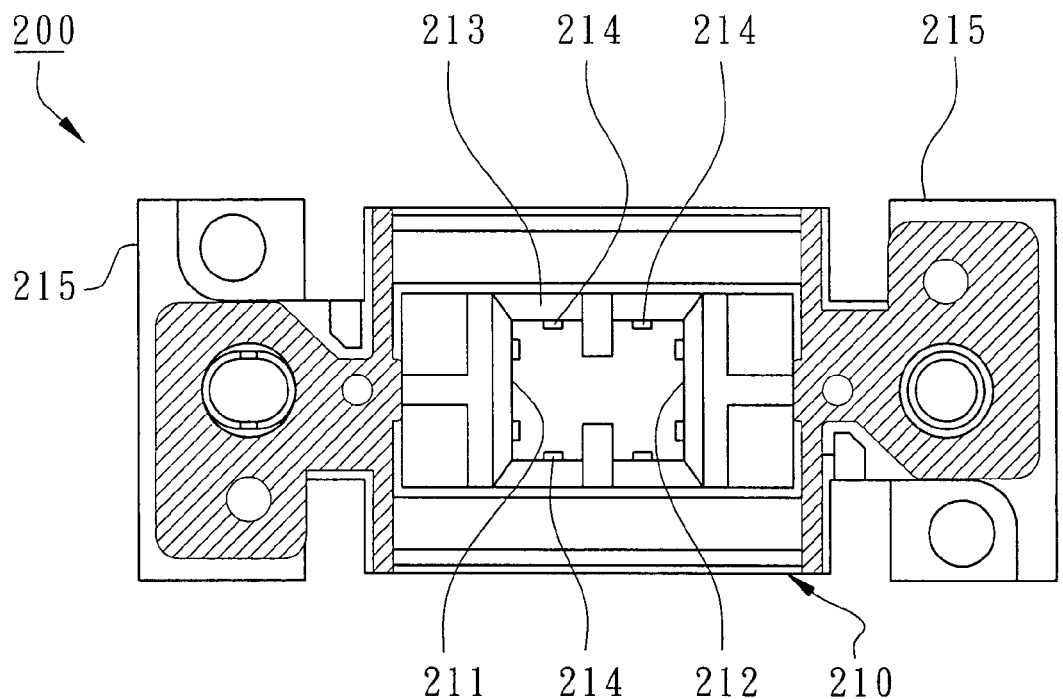
FIG. 1 shows a top view of a conventional insert for BGA packages.
Figure 2:
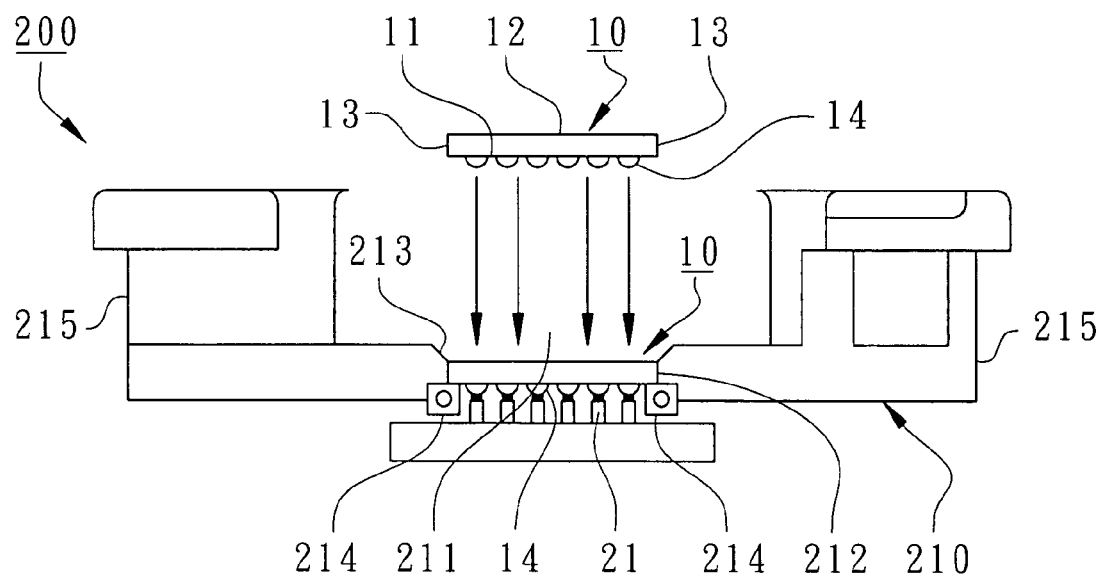
FIG. 2 shows a cross-sectional view of a conventional insert for BGA packages under test.

As shown in FIG. 2 and FIG. 6, preferably, the base 110 further has a central opening 116 located at the center of the component cavity 111 and surrounded with the aligning ball holes 113 and 114 to visually confirm the alignment accuracy of a BGA package 10 under test.

Normally, the meshed base 110 is made of electrically isolating material or coated with an isolated layer to avoid short of the meshed base 110 while the solder balls 14 are contacted with the aligning ball holes 113 and 114.

As shown in FIG. 5, the latch 120 is disposed inside the component cavity 110 where the latch 120 has a pressing pin 121 extruded into the component cavity 111, as shown in FIG. 6, and is connected to a latch spring 122 to provide pressing and holding forces. As shown in FIG. 7, the latch 120 can press and hold the back surface of a BGA package 10 to avoid the solder balls 14 of the BGA package 10 release from the corresponding aligning ball holes 113 or 114.

As shown in FIG. 4, FIG. 5, and FIG. 7, the lift pins 130 flexibly extend from the peripheries of the mounting surface 112 of the meshed base 110 where a plurality of lift springs 131 provide the extruding forces for the lift pins 130. As shown in FIG. 7, during testing, the lift pins 130 are embedded in the alignment holes of a testing socket 20 so that the probes 21 inside the testing base 20 can accurately align to the ball aligning cavities 113 and 114 of the meshed base 110.

As shown in FIG. 5 and FIG. 6, in the present embodiment, the universal insert 100 further comprises a cover 140 embedded in the meshed base 110 without covering the component cavity 111. A plurality of actuation springs 141 are disposed between the cover 140 and the meshed base 110 so that the universal insert 100 can be firmly connected. A plurality of wing-type joint parts 117 each having a joint hole 118 are formed at sides of the universal insert 110 for connecting to a testing board.

Therefore, the solder balls 14 of the BGA package 10 can be one-on-one aligned to some of the aligning ball holes 113 and 114 when the universal insert 100 carries a BGA package 100. As long as the spacing between the solder balls 14 is the same, all kinds of BGA packages 10 with different electronic products can be aligned and held in the universal insert 100 in spite of different substrate dimensions, numbers of solder balls, and layouts of solder balls. Therefore, during testing different BGA packages with same pitch of solder balls 14, the universal insert 100 has excellently universal characteristics without frequent interchanges. The frequency of interchanging inserts can be reduced as the one of interchanging testing sockets to increase utilization of testers and to reduce the numbers of inserts in stock.

The above description of embodiments of this invention is intended to be illustrative and not limiting. Other embodiments of this invention will be obvious to those skilled in the art in view of the above disclosure.

What is claimed is:

1. A universal insert for carrying a BGA package comprising:
    a meshed base having a component cavity, a mounting surface and a plurality of aligning ball holes in the component cavity, wherein the aligning ball holes are arranged in an array with an equal pitch;
    at least a latch disposed inside the meshed base to press and hold the BGA package; and
    a plurality of lift pins flexibly extending from the peripheries of the mounting surface of the meshed base;
    during probe testing, the component cavity accommodates the BGA package inside, at least some of the aligning ball holes are one-on-one aligned to a plurality of solder balls of the BGA package so that the solder balls are exposed from the corresponding aligning ball holes on the mounting surface;
    the aligning ball holes include a plurality of first aligning ball holes and a plurality of second aligning ball holes, wherein the hole depths of the second aligning ball holes are smaller than the ones of the first aligning ball holes.

2. The universal insert as claimed in claim 1, wherein at least a dent is formed on a bottom surface of the component cavity opposing to the mounting surface, wherein the second aligning ball holes are located within the dent.

3. The universal insert as claimed in claim 2, wherein the dent is ribbon-like.

4. The universal insert as claimed in claim 2, wherein the dents are located at two opposing sides of the bottom surface of the component cavity.

5. The universal insert as claimed in claim 4, wherein the diameters of the second aligning ball holes are smaller than the ones of the first aligning ball holes.

6. The universal insert as claimed in claim 1, further comprising a cover disposed on the meshed base without covering the component cavity.

7. The universal insert as claimed in claim 6, further comprising a plurality of actuation springs disposed between the cover and the meshed base.

8. The universal insert as claimed in claim 1, wherein a central opening is disposed inside a central area of the component cavity and surrounded with the aligning ball holes.

9. The universal insert as claimed in claim 1, wherein the meshed base is made of electrically isolating material.

* * * * *